US008956457B2

United States Patent
Lee et al.

(10) Patent No.: US 8,956,457 B2
(45) Date of Patent: *Feb. 17, 2015

(54) THERMAL PROCESSING SYSTEM FOR CURING DIELECTRIC FILMS

(75) Inventors: Eric M. Lee, Austin, TX (US); Junjun Liu, Austin, TX (US); Dorel I. Toma, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 1217 days.

This patent is subject to a terminal disclaimer.

(21) Appl. No.: 11/517,358

(22) Filed: Sep. 8, 2006

(65) Prior Publication Data

US 2008/0063809 A1 Mar. 13, 2008

(51) Int. Cl.
*C23C 16/00* (2006.01)
*B05B 5/00* (2006.01)
*H01L 21/67* (2006.01)
*H01L 21/3105* (2006.01)
*H01L 21/316* (2006.01)

(52) U.S. Cl.
CPC ...... *H01L 21/67115* (2013.01); *H01L 21/3105* (2013.01); *H01L 21/31058* (2013.01); *H01L 21/31612* (2013.01); *H01L 21/31695* (2013.01)
USPC .......................................... 118/724; 118/643

(58) Field of Classification Search
USPC ................. 118/620, 715, 719, 722, 724, 725, 118/641–643
See application file for complete search history.

(56) References Cited

U.S. PATENT DOCUMENTS

| | | | |
|---|---|---|---|
| 5,288,526 A * | 2/1994 | Hogan et al. | 427/492 |
| 5,314,538 A * | 5/1994 | Maeda et al. | 118/715 |
| 5,705,232 A | 1/1998 | Hwang et al. | |
| 5,710,407 A * | 1/1998 | Moore et al. | 219/405 |
| 6,232,248 B1 * | 5/2001 | Shinriki et al. | 438/785 |
| 6,303,524 B1 | 10/2001 | Sharangpani et al. | |
| 6,444,037 B1 | 9/2002 | Frankel et al. | |
| 6,596,467 B2 | 7/2003 | Gallagher et al. | |
| 6,689,218 B2 | 2/2004 | Potyralio et al. | |
| 6,692,903 B2 | 2/2004 | Chen et al. | |
| 6,756,085 B2 | 6/2004 | Waldfried et al. | |
| 6,764,718 B2 | 7/2004 | Nakamura et al. | |
| 6,786,974 B2 * | 9/2004 | Komiya et al. | 118/719 |
| 6,818,864 B2 * | 11/2004 | Ptak | 219/390 |
| 6,962,871 B2 | 11/2005 | Lee et al. | |
| 7,000,621 B1 | 2/2006 | Verhaverbeke | |
| 7,030,468 B2 | 4/2006 | Gates et al. | |
| 7,081,638 B1 | 7/2006 | Augur | |

(Continued)

OTHER PUBLICATIONS

Willi Volksen, et al., "Laser Spike Annealing: A Novel Post-Porosity Treatment for Significant Toughening of Low-k Organosilicates", IEEE, 2006, pp. 146-148.

(Continued)

*Primary Examiner* — Maureen Gramaglia
(74) *Attorney, Agent, or Firm* — Oblon, Spivak, McClelland, Maier & Neustadt, L.L.P.

(57) ABSTRACT

A thermal processing system and method for curing a dielectric film. The thermal processing system is configured to treat the dielectric film with ultraviolet (UV) radiation and infrared (IR) radiation in order to cure the dielectric film. The thermal processing system can include an array if IR and UV light-emitting devices (LEDs) configured to irradiate a substrate having a low dielectric constant (low-k) film. The method dries the dielectric film to remove contaminants from the film and exposes the dielectric film at a single stage to ultraviolet radiation and IR radiation.

20 Claims, 7 Drawing Sheets

(56) References Cited

U.S. PATENT DOCUMENTS

| | | | |
|---|---|---|---|
| 7,098,149 | B2 | 8/2006 | Lukas et al. |
| 7,166,531 | B1 | 1/2007 | Van Den Hoek et al. |
| 7,166,963 | B2 | 1/2007 | Janos et al. |
| 7,223,670 | B2 | 5/2007 | Callegari et al. |
| 7,282,458 | B2 | 10/2007 | Gates et al. |
| 7,622,378 | B2 * | 11/2009 | Liu et al. ............... 438/620 |
| 2002/0092472 | A1 | 7/2002 | Hayashi et al. |
| 2003/0054115 | A1 | 3/2003 | Albano et al. |
| 2003/0070690 | A1 | 4/2003 | Danese |
| 2003/0077399 | A1 * | 4/2003 | Potyrailo et al. ............ 427/532 |
| 2003/0224544 | A1 | 12/2003 | Prisco et al. |
| 2004/0018319 | A1 | 1/2004 | Waldfried et al. |
| 2004/0096593 | A1 | 5/2004 | Lukas et al. |
| 2004/0096672 | A1 | 5/2004 | Lukas et al. |
| 2004/0166628 | A1 | 8/2004 | Park et al. |
| 2004/0175501 | A1 | 9/2004 | Lukas et al. |
| 2004/0175957 | A1 | 9/2004 | Lukas et al. |
| 2004/0253839 | A1 | 12/2004 | Shimizu et al. |
| 2005/0064726 | A1 * | 3/2005 | Reid et al. ............... 438/778 |
| 2005/0085094 | A1 | 4/2005 | Yoo |
| 2005/0272220 | A1 | 12/2005 | Waldfried et al. |
| 2006/0018639 | A1 | 1/2006 | Ramamurthy et al. |
| 2006/0024976 | A1 | 2/2006 | Waldfried et al. |
| 2006/0141806 | A1 | 6/2006 | Waldfried et al. |
| 2006/0165904 | A1 | 7/2006 | Ohara |
| 2006/0183345 | A1 | 8/2006 | Nguyen et al. |
| 2006/0202311 | A1 | 9/2006 | Nguyen et al. |
| 2006/0249078 | A1 | 11/2006 | Nowak et al. |
| 2006/0251827 | A1 | 11/2006 | Nowak et al. |
| 2006/0274405 | A1 | 12/2006 | Waldfried et al. |
| 2007/0105401 | A1 | 5/2007 | Liu et al. |
| 2007/0161230 | A1 | 7/2007 | Chen et al. |
| 2007/0228289 | A1 | 10/2007 | Kaszuba et al. |
| 2007/0228618 | A1 | 10/2007 | Kaszuba et al. |
| 2007/0257205 | A1 | 11/2007 | Rocha-Alvarez et al. |
| 2007/0264786 | A1 | 11/2007 | Chen et al. |
| 2007/0284698 | A1 | 12/2007 | Callegari et al. |
| 2007/0286963 | A1 | 12/2007 | Rocha-Alvarez et al. |
| 2008/0063809 | A1 | 3/2008 | Lee et al. |

OTHER PUBLICATIONS

Thomas Abell, et al., "Solid state MAS NMR spectroscopic characterization of plasma damage and UV modification of low k dielectric films", Mater. Res. Soc. Symp. Proc., vol. 863, Materials Research Society, 2005, pp. B1.8.1-B1.8.6.

Office Action issued Sep. 22, 2011 in Taiwanese Application No. 096129809 (With English Translation).

\* cited by examiner

THERMAL PROCESSING SYSTEM FOR CURING DIELECTRIC FILMS

BACKGROUND OF THE INVENTION

1. Field of the Invention

The present invention relates to a system for treating a dielectric film and, more particularly, to a system for curing a dielectric film using infrared (IR) and ultraviolet (UV) radiation.

2. Description of Related Art

As is known to those in the semiconductor art, interconnect delay is a limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices. Additionally, in order to further reduce the dielectric constant of insulating materials, material films have been formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Low-k materials are less robust than more traditional silicon dioxide, and the mechanical strength deteriorates further with the introduction of porosity. The porous low-k films can easily be damaged during plasma processing, thereby making desirable a mechanical strengthening process. It has been understood that enhancement of the material strength of porous low-k dielectrics is used for their successful integration. Aimed at mechanical strengthening, alternative curing techniques are being explored to make porous low-k films more robust and suitable for integration.

The curing of a polymer includes a process whereby a thin film deposited for example using spin-on or vapor deposition (such as chemical vapor deposition CVD) techniques, is treated in order to cause cross-linking within the film. During the curing process, free radical polymerization is understood to enhance cross-linking. As polymer chains cross-link, mechanical properties, such as for example the Young's modulus, the film hardness, the fracture toughness and the interfacial adhesion, are improved, thereby improving the fabrication robustness of the low-k film.

As there are various strategies to forming porous dielectric films with ultra low dielectric constant, the objectives of post-deposition treatments (curing) may vary from film to film, including for example the removal of moisture, the removal of solvents, the burn-out of porogens used to form the pores in the porous dielectric film, the improvement of the mechanical properties for such films, and so on.

Low dielectric constant (low k) materials are conventionally thermally cured at a temperature in the range of 300° C. to 400° C. for CVD films. For instance, furnace curing has been sufficient in producing strong, dense low-k films with a dielectric constant greater than approximately 2.5. However, when processing porous dielectric films (such as ultra low-k films) with a high level of porosity, the degree of cross-linking achievable with thermal treatment (or thermal curing) is no longer sufficient to produce films of adequate strength for a robust interconnect structure.

During thermal curing, it has been noticed that the appropriate amount of energy is delivered to the film without damaging the dielectric film. Within the temperature range of interest, however, only a small amount of free radicals can be generated. Due to the thermal energy lost in the coupling of heat to the substrate and the heat loss in the ambient environment, only a small amount of thermal energy can actually be absorbed in the low-k films to be cured. Therefore, high temperatures and long curing times are required for typical low-k furnace curing. But even with a high thermal budget, the lack of initiator generation in the thermal curing and the presence of a large amount of methyl termination in the as-deposited low-k film can make it very difficult to achieve the desired degree of cross-linking.

SUMMARY OF THE INVENTION

One aspect of the present invention permits reduction or elimination of any of the above-described problems or other problems in the prior art relating to processing dielectric films.

Another aspect of the present invention permits treatment of a dielectric film in order to cure the dielectric film.

Yet another aspect of the present invention permits treatment of a dielectric film by performing an in-situ, multi-step drying and curing process using multiple process modules coupled to one another.

Any of these and/or other aspects may be provided by a processing system for treating a dielectric film in accordance with the present invention. In one embodiment, the processing system for treating a dielectric film on a substrate includes: a process chamber configured to facilitate the treatment process; a substrate holder coupled to the process chamber, and configured to support the substrate in the process chamber; a temperature control system coupled to the substrate holder and configured to elevate the temperature of the substrate; a multi-spectrum radiation source coupled to the process chamber, and configured to irradiate the substrate with infrared (IR) radiation and ultraviolet (UV) radiation, the multi-spectrum radiation source including: an IR radiation source having a first array of IR light-emitting devices (LEDs), and a UV radiation source having a second array of UV LEDs; and a vacuum pumping system coupled to the process chamber, and configured to evacuate the process chamber.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the processing system and descriptions of various components. However, it should be understood that the invention may be practiced in other embodiments that depart from these specific details.

The present invention recognized that alternative curing methods address some of the deficiencies of thermal curing. For instance, alternative curing methods are more efficient in energy transfer, as compared to thermal curing processes, and the higher energy levels found in the form of energetic particles, such as accelerated electrons, ions, or neutrals, or in the form of energetic photons, can easily excite electrons in a low-k film, thus efficiently breaking chemical bonds and dissociating side groups. These alternative curing methods facilitate the generation of cross-linking initiators (free radicals) and can improve the energy transfer required in actual cross-linking. As a result, the degree of cross-linking can be increased at a reduced thermal budget.

Additionally, the present invention accounts for the realization that, as film strength becomes a greater issue for the integration of ultra low-k (ULK) dielectric films (dielectric constant less than approximately 2.5), alternative curing methods can improve the mechanical properties of such films. For example, electron beam (EB), ultraviolet (UV) radiation, infrared (IR) radiation and microwave (MW) radiation may be used to cure ULK films in order to improve mechanical strength, while not sacrificing the dielectric property and film hydrophobicity.

However, although EB, UV, IR and MW curing all have their own benefits, these techniques also have limitations. High energy curing sources such as EB and UV can provide high energy levels to generate more than enough free radicals for cross-linking, which leads to much improved mechanical properties under complementary substrate heating. On the other hand, electrons and UV photons can cause indiscriminate dissociation of chemical bonds, which may adversely degrade the desired physical and electrical properties of the film, such as loss of hydrophobicity, increased residual film stress, collapse of pore structure, film densification and increased dielectric constant. Furthermore, low energy curing sources, such as IR and MW curing, can provide significant improvements mostly in the heat transfer efficiency, but in the meantime have side effects, such as for example skin layer or surface densification (IR), and arcing or transistor damage (MW).

Figure 1A:
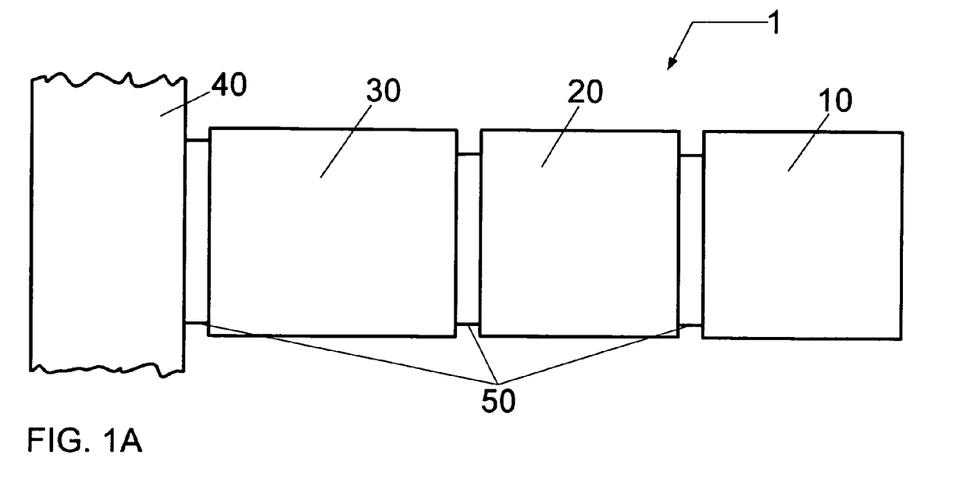
FIGS. 1A through 1C are schematic representations of a transfer system for a drying system and a curing system according to an embodiment of the present invention.

Referring now to the drawings, wherein like reference numerals designate identical or corresponding parts throughout the several views, FIG. 1A shows a processing system 1 for treating a dielectric film on a substrate, according to one embodiment of the present invention. The processing system 1 includes a drying system 10, and a curing system 20 coupled to the drying system 10. For example, the drying system 10 can be configured to remove, or reduce to sufficient levels, one or more contaminants in the dielectric film, including, for example, moisture, solvent, porogen, or any other contaminant that may interfere with a curing process performed in the curing system 20.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Referring still to FIG. 1A, the curing system 20 can be configured to cure the dielectric film by causing or partially causing cross-linking within the dielectric film in order to, for example, improve the mechanical properties of the dielectric film. The curing system 20 can include two or more radiation sources configured to expose the substrate having the dielectric film to electro-magnetic (EM) radiation at multiple EM wavelengths. For example, the two or more radiation sources can include an infrared (IR) radiation source and an ultraviolet (UV) radiation source. The exposure of the substrate to UV radiation and IR radiation can be performed simultaneously, sequentially, or over-lapping one another. During sequential exposure, the exposure of the substrate to UV radiation can, for instance, precede the exposure of the substrate to IR radiation or vice versa.

For example, the IR radiation can include an IR wave-band source ranging from approximately 1 micron to approximately 30 microns and, desirably, ranging from approximately 5 microns to approximately 30 microns. Further yet, for example, the IR radiation can include an IR wave-band source ranging from approximately 5 microns to approximately 25 microns and, more desirably, ranging from approximately 8 microns to approximately 14 microns (e.g., approximately 10.6 microns). Additionally, for example, the UV radiation can include a UV wave-band source producing radiation ranging from approximately 100 nanometers (nm) to approximately 600 nm and, desirably, ranging from approximately 200 nm to approximately 400 nm. Further yet, for example, the UV radiation can include a UV wave-band source producing radiation ranging from approximately 220 nm to approximately 280 nm and, more desirably, ranging from 230 nm to approximately 250 nm (e.g., approximately 240 nm).

The present invention have recognized that the energy level (h$\square$) and the rate that energy is delivered to the dielectric film (q') varies during different stages of the curing process. The curing process can include mechanisms for generation of cross-link initiators, burn-out of porogens, decomposition of porogens, film cross-linking, and optionally cross-link initiator diffusion. Each mechanism may require a different energy level and rate at which energy is delivered to the dielectric film. For instance, during the curing of the matrix material, cross-link initiators may be generated using photon and phonon induced bond dissociation within the matrix material. Bond dissociation can require energy levels having a wavelength less than or equal to approximately 300 to 400 nm. Additionally, for instance, porogen burn-out may be facilitated with photon absorption by the photosensitizer. Porogen burn-out may require UV wavelengths, such as wavelengths less than or equal to approximately 200 to 400 nm. Further yet, for instance, cross-linking can be facilitated by thermal energy sufficient for bond formation and reorganization. Bond formation and reorganization may require energy levels having a wavelength of approximately 9 microns which, for example, corresponds to the main absorbance peak in siloxane-based organosilicate low-k materials.

The substrate, to be treated, may be a semiconductor, a metallic conductor, or any other substrate to which the dielectric film is to be formed upon. The dielectric film can have a dielectric constant value (before drying and/or curing, or after drying and/or curing, or both) less than the dielectric constant of $SiO_2$, which is approximately 4 (e.g., the dielectric constant for thermal silicon dioxide can range from 3.8 to 3.9). In various embodiments of the invention, the dielectric film may have a dielectric constant (before drying and/or curing, or after drying and/or curing, or both) of less than 3.0, a dielectric constant of less than 2.5, or a dielectric constant ranging from 1.6 to 2.7. The dielectric film may be described as a low-k film or an ultra low-k film. The dielectric film may, for instance, include a dual phase porous low-k film which may have a higher dielectric constant prior to porogen burn-out than following porogen burn-out. Additionally, the dielectric film may have moisture and/or other contaminants which cause the dielectric constant to be higher prior to drying and/or curing than following drying and/or curing.

The dielectric film can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

The dielectric film can, for example, be characterized as a low dielectric constant (or low-k) dielectric film. The dielectric film may include at least one of an organic, inorganic, and inorganic-organic hybrid material. Additionally, the dielectric film may be porous or non-porous. For example, the dielectric film may include an inorganic, silicate-based material, such as oxidized organosilane (or organo siloxane), deposited using CVD techniques. Examples of such films include Black Diamonds CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having terminal organic side groups that inhibit cross-linking during a curing process to create small voids (or pores). Additionally, for example, porous dielectric films can include dual-phase materials, such as a silicon oxide-based matrix having inclusions of organic material (e.g., a porogen) that is decomposed and evaporated during a curing process. Alternatively, the dielectric film may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film can include an organic material deposited using SOD techniques. Examples of such films include SiLK-I, SiLK-J, SiLK-H, SiLK-D, porous SiLK-T, porous SiLK-Y, and porous SiLK-Z semiconductor dielectric resins commercially available from Dow Chemical, and FLARE™, and Nano-glass commercially available from Honeywell.

Also, as illustrated in FIG. 1A, a transfer system 30 can be coupled to the drying system 10 in order to transfer substrates into and out of the drying system 10 and the curing system 20, and exchange substrates with a multi-element manufacturing system 40. Transfer system 30 may transfer substrates to and from drying system 10 and curing system 20 while maintaining a vacuum environment. The drying and curing systems 10, 20, and the transfer system 30 can, for example, include a processing element within the multi-element manufacturing system 40. For example, the multi-element manufacturing system 40 can permit the transfer of substrates to and from processing elements including such devices as etch systems, deposition systems, coating systems, patterning systems, metrology systems, etc. In order to isolate the processes occurring in the first and second systems, an isolation assembly 50 can be utilized to couple each system. For instance, the isolation assembly 50 can include at least one of a thermal insulation assembly to provide thermal isolation, and a gate valve assembly to provide vacuum isolation. The drying and curing systems 10 and 20, and transfer system 30 can be placed in any sequence.

Figure 1B:
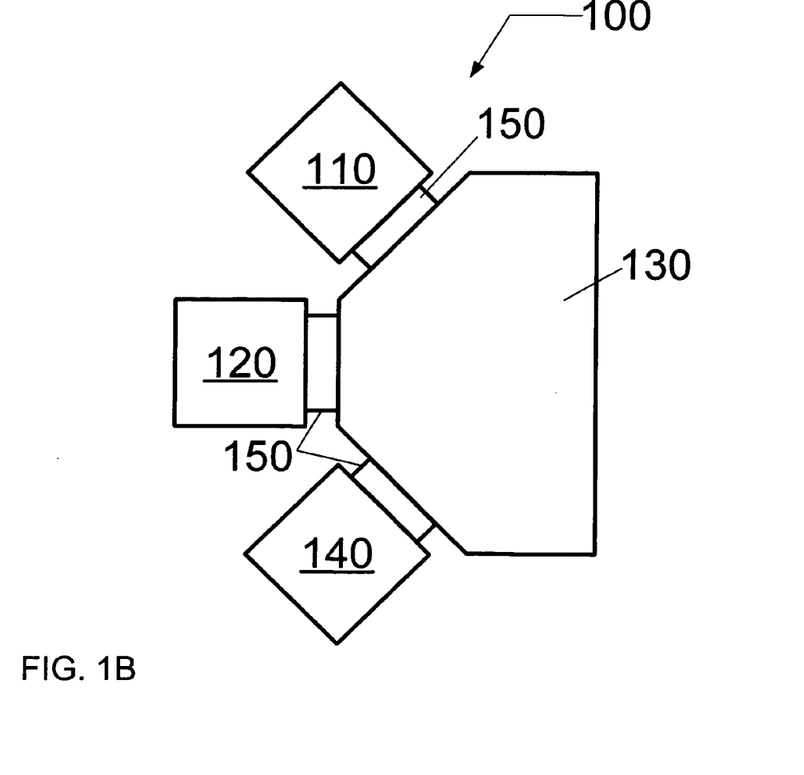

Alternately, in another embodiment of the invention, FIG. 1B shows a processing system 100 for treating a dielectric film on a substrate. The processing system 100 includes a "cluster-tool" arrangement for a drying system 110, and a curing system 120. For example, the drying system 110 can be configured to remove, or reduce to sufficient levels, one or more contaminants in the dielectric film, including, for example, moisture, solvent, porogen, or any other contaminant that may interfere with a curing process performed in the curing system 120. Additionally, for example, the curing system 120 can be configured to cure the dielectric film by causing or partially causing cross-linking within the dielectric film in order to, for example, improve the mechanical properties of the dielectric film. Furthermore, the processing system 100 can optionally include a post-treatment system 140 configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions.

Also, as illustrated in FIG. 1B, a transfer system 130 can be coupled to the drying system 110 in order to transfer substrates into and out of the drying system 110, and can be coupled to the curing system 120 in order to transfer substrates into and out of the curing system 120, and can be coupled to the optional post-treatment system 140 in order to transfer substrates into and out of the post-treatment system 140. Transfer system 130 may transfer substrates to and from drying system 110, curing system 120 and optional post-treatment system 140 while maintaining a vacuum environment.

Additionally, transfer system 130 can exchange substrates with one or more substrate cassettes (not shown). Although only two or three process systems are illustrated in FIG. 1B, other process systems can access transfer system 130 including for example such devices as etch systems, deposition systems, coating systems, patterning systems, metrology systems, etc. In order to isolate the processes occurring in the drying and curing systems, an isolation assembly 150 can be utilized to couple each system. For instance, the isolation assembly 150 can include at least one of a thermal insulation assembly to provide thermal isolation, and a gate valve assembly to provide vacuum isolation. Additionally, for example, the transfer system 130 can serve as part of the isolation assembly 150.

Figure 1C:
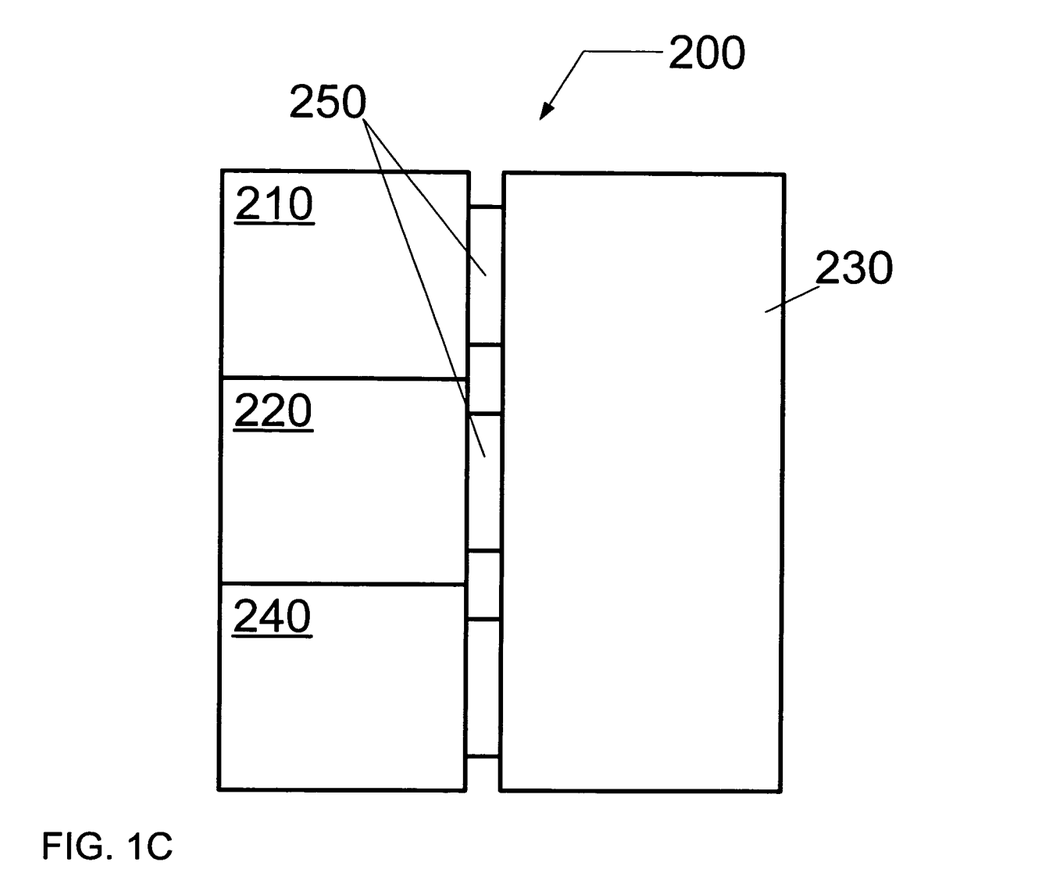

Alternatively, in another embodiment of the invention, FIG. 1C shows a processing system 200 for treating a dielectric film on a substrate. The processing system 200 includes a drying system 210, and a curing system 220. For example, the drying system 210 can be configured to remove, or reduce to sufficient levels, one or more contaminants in the dielectric film, including, for example, moisture, solvent, porogen, or any other contaminant that may interfere with a curing process performed in the curing system 220. Additionally, for example, the curing system 220 can be configured to cure the dielectric film by causing or partially causing cross-linking within the dielectric film in order to, for example, improve the mechanical properties of the dielectric film. Furthermore, the processing system 200 can optionally include a post-treatment system 240 configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions.

Drying system 210, curing system 220, and post-treatment system 240 can be arranged horizontally or may be arranged vertically (i.e., stacked). Also, as illustrated in FIG. 1C, a transfer system 230 can be coupled to the drying system 210 in order to transfer substrates into and out of the drying system 210, can be coupled to the curing system 220 in order to transfer substrates into and out of the curing system 220, and can be coupled to the optional post-treatment system 240 in order to transfer substrates into and out of the post-treatment system 240. Transfer system 230 may transfer substrates to and from drying system 210, curing system 220 and optional post-treatment system 240 while maintaining a vacuum environment.

Additionally, transfer system 230 can exchange substrates with one or more substrate cassettes (not shown). Although only three process systems are illustrated in FIG. 1C, other process systems can access transfer system 230 including for example such devices as etch systems, deposition systems, coating systems, patterning systems, metrology systems, etc. In order to isolate the processes occurring in the first and second systems, an isolation assembly 250 can be utilized to couple each system. For instance, the isolation assembly 250 can include at least one of a thermal insulation assembly to provide thermal isolation, and a gate valve assembly to provide vacuum isolation. Additionally, for example, the transfer system 230 can serve as part of the isolation assembly 250.

At least one of the drying system 10 and the curing system 20 of the processing system 1 as depicted in FIG. 1A includes at least two transfer openings to permit the passage of the substrate therethrough. For example, as depicted in FIG. 1A, the drying system 10 includes two transfer openings, the first transfer opening permits the passage of the substrate between the drying system 10 and the transfer system 30 and the second transfer opening permits the passage of the substrate between the drying system and the curing system. However, regarding the processing system 100 depicted in FIG. 1B and the processing system 200 depicted in FIG. 1C, each treatment system 110, 120, 140 and 210, 220, 240, respectively, includes at least one transfer opening to permit the passage of the substrate therethrough.

Figure 2:
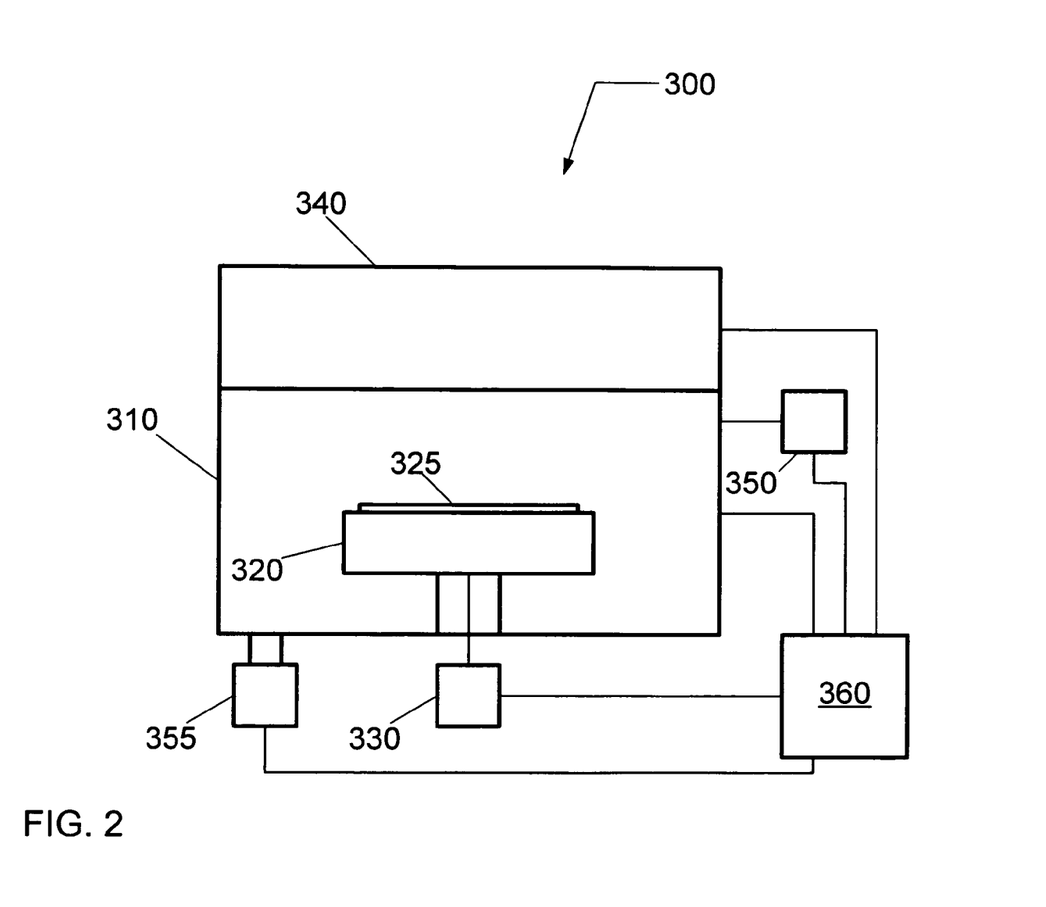
FIG. 2 is a schematic cross-sectional view of a drying system according to another embodiment of the present invention.

Referring now to FIG. 2, a drying system 300 is shown according to another embodiment of the invention. Drying system 300 includes a drying chamber 310 configured to produce a clean, contaminant-free environment for drying a substrate 325 resting on substrate holder 320. The drying system 300 can include a thermal treatment device 330 coupled to drying chamber 310, or to substrate holder 320, and configured to evaporate contaminants, such as for example moisture, residual solvent, etc., by elevating the temperature of substrate 325. Furthermore, the drying system 300 can include a microwave treatment device 340 coupled to the drying chamber 310, and configured to locally heat contaminants in the presence of an oscillating electric field. The drying process can utilize the thermal treatment device 330, or the microwave treatment device 340, or both to facilitate drying a dielectric film on substrate 325.

The thermal treatment device 330 can include one or more conductive heating elements embedded in substrate holder 320 coupled to a power source and a temperature controller. For example, each heating element can include a resistive heating element coupled to a power source configured to supply electrical power. Alternatively, the thermal treatment device 330 can include one or more radiative heating elements coupled to a power source and a controller. For example, each radiative heating element can include a heat lamp coupled to a power source configured to supply electrical power. The temperature of substrate 325 can, for example, range from approximately 20° C. to approximately 500° C., and desirably, the temperature may range from approximately 200° C. to approximately 400° C.

The microwave treatment source 340 can include a variable frequency microwave source configured to sweep the microwave frequency through a bandwidth of frequencies. Frequency variation avoids charge build-up and, hence, permits damage-free application of microwave drying techniques to sensitive electronic devices.

In one example, the drying system 300 can include a drying system incorporating both a variable frequency microwave device and a thermal treatment device, such as for example the microwave furnace commercially available from Lambda Technologies, Inc. (860 Aviation Parkway, Suite 900, Morrisville, N.C. 27560). For additional details, a microwave furnace is described in U.S. Pat. No. 5,738,915, assigned to Lambda Technologies, Inc., and entitled "Curing polymer layers on semiconductor substrates using variable frequency microwave energy"; the entire contents of which are incorporated herein by reference.

The substrate holder 320 may or may not be configured to clamp substrate 325. For instance, substrate holder 320 may be configured to mechanically or electrically clamp substrate 325.

Referring again to FIG. 2, drying system 300 can further include a gas injection system 350 coupled to the drying chamber and configured to introduce a purge gas to drying chamber 310. The purge gas can, for example, include an inert gas, such as a noble gas or nitrogen. Additionally, drying system 300 can include a vacuum pumping system 355 coupled to drying chamber 310 and configured to evacuate the drying chamber 310. During a drying process, substrate 325 can be subject to an inert gas environment with or without vacuum conditions.

Furthermore, drying system 300 can include a controller 360 coupled to drying chamber 310, substrate holder 320, thermal treatment device 330, microwave treatment device 340, gas injection system 350, and vacuum pumping system 355. Controller 360 includes a microprocessor, a memory, and a digital I/O port capable of generating control voltages sufficient to communicate and activate inputs to the drying system 300 as well as monitor outputs from the drying system 300. A program stored in the memory is utilized to interact with the drying system 300 according to a stored process recipe. The controller 360 can be used to configure any number of processing elements (310, 320, 330, 340, 350, or 355), and the controller 360 can collect, provide, process, store, and display data from processing elements. The controller 360 can include a number of applications for controlling one or more of the processing elements. For example, controller 360 can include a graphic user interface (GUI) component (not shown) that can provide interfaces that enable a user to monitor and/or control one or more processing elements.

Referring now to FIG. 3, a curing system 400 is shown according to another embodiment of the present invention. Curing system 400 includes a curing chamber 410 configured to produce a clean, contaminant-free environment for curing a substrate 425 resting on substrate holder 420. Curing system 400 further includes two or more radiation sources configured to expose substrate 425 having the dielectric film to electromagnetic (EM) radiation at multiple EM wavelengths. The two or more radiation sources can include an infrared (IR) radiation source 440 and an ultraviolet (UV) radiation source 445. The exposure of the substrate to UV radiation and IR radiation can be performed simultaneously, sequentially, or over-lapping one another.

Figure 3:
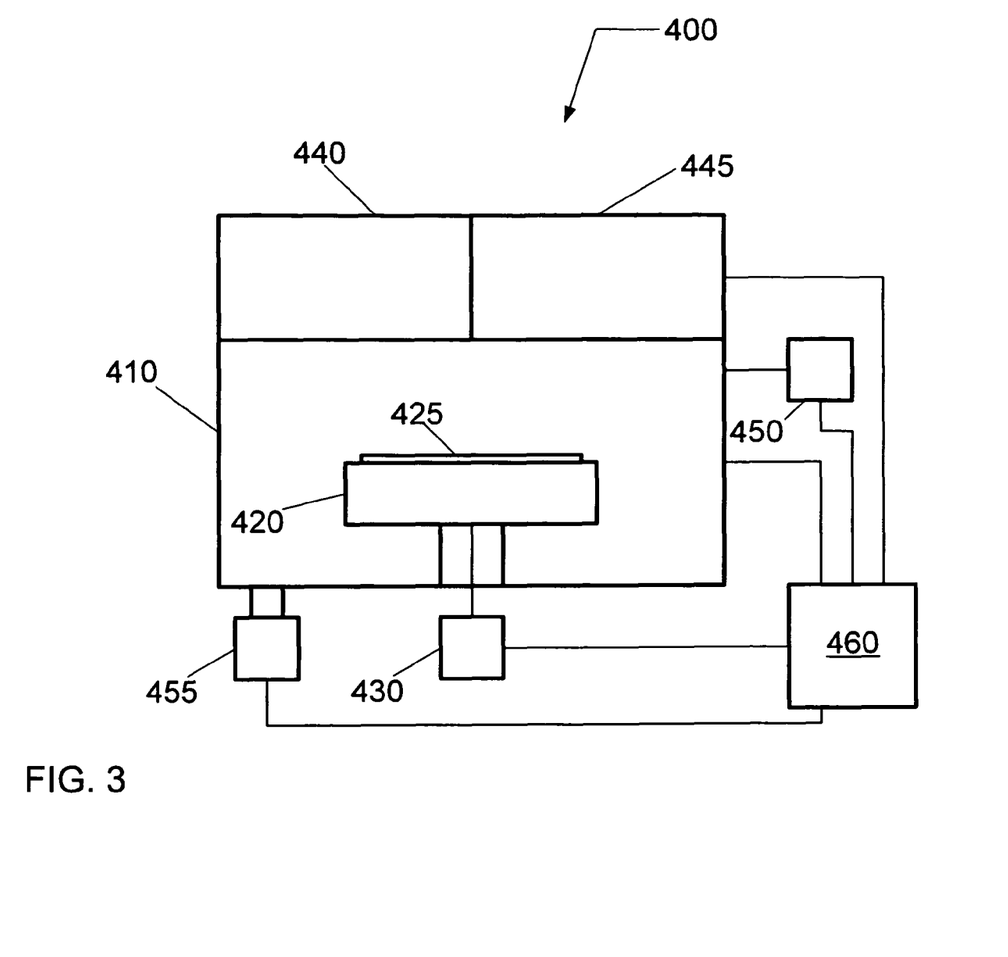
FIG. 3 is a schematic cross-sectional view of a curing system according to another embodiment of the present invention.

The IR radiation source 440 may include a broad-band IR source, or may include a narrow-band IR source. The IR radiation source can include one or more IR lamps, or one or more IR lasers (continuous wave (CW), tunable, or pulsed), or any combination thereof. The IR power can range from approximately 0.1 mW to approximately 2000 W. The IR radiation wavelength can range from approximately 1 micron to approximately 30 microns and, desirably, can range from approximately 8 microns to approximately 14 microns. For example, the IR radiation source 440 can include an IR element, such as a ceramic element or silicon carbide element, having a spectral output ranging from approximately 1 micron to approximately 30 microns, or the IR radiation source 440 can include a semiconductor laser (diode), or ion, Ti:sapphire, or dye laser with optical parametric amplification.

For example, the IR radiation source 440 can include an IR LED lamp commercially available from Laser 2000 GmbH (Argelsrieder Feld 14, D-82234 Wessling, Munchen).

The UV radiation source 445 may include a broad-band UV source, or may include a narrow-band UV source. The UV radiation source can include one or more UV lamps, or one or more UV lasers (continuous wave (CW), tunable, or pulsed), or any combination thereof. UV radiation can be generated, for instance, from a microwave source, an arc discharge, a dielectric barrier discharge, or electron impact generation. The UV power density can range from approximately 0.1 mW/cm$^2$ to approximately 2000 mW/cm$^2$. The UV wavelength can range from approximately 100 nanometers (nm) to approximately 600 nm and, desirably, can range from approximately 200 nm to approximately 400 nm. For example, the UV radiation source 445 can include a direct current (DC) or pulsed lamp, such as a Deuterium ($D_2$) lamp, having a spectral output ranging from approximately 180 nm to approximately 500 nm, or the UV radiation source 445 can include a semiconductor laser (diode), (nitrogen) gas laser, frequency-tripled Nd:YAG laser, or copper vapor laser.

For example, the UV radiation source 445 can include a high power UV LED lamp commercially available from Sensor Electronic Technology, Inc. (1195 Atlas Road, Columbia, S.C. 29209).

The IR radiation source 440, or the UV radiation source 445, or both, may include any number of optical devices to adjust one or more properties of the output radiation. For example, each source may further include optical filters, optical lenses, beam expanders, beam collimators, etc. Such optical manipulation devices as known to those skilled in the art of optics and EM wave propagation are suitable for the invention. Additionally, for example, the IR radiation source 440, or the UV radiation source 445, or both, can be operated in continuous mode or pulsed mode. Further yet, for example, the IR radiation source 440, or the UV radiation source 445, or both, can be adjusted in temperature using temperature control elements, such as a fluid cooling (or heating) system, thermoelectric devices, or cryogenic cooling system, or a combination of two or more thereof.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 could optionally include one or more radiative heating elements. The temperature of substrate 425 can, for example, range from approximately 20° C. to approximately 500° C., and desirably, the temperature may range from approximately 200° C. to approximately 400° C.

Additionally, the substrate holder 420 may or may not be configured to clamp substrate 425. For instance, substrate holder 420 may be configured to mechanically or electrically clamp substrate 425.

Referring again to FIG. 3, curing system 400 can further include a gas injection system 450 coupled to the curing chamber 410 and configured to introduce a purge gas to curing chamber 410. The purge gas can, for example, include an inert gas, such as a noble gas or nitrogen. Alternatively, the purge gas can include other gases, including reactive gases, such as but not limited to for example $H_2$, $O_2$, $NH_3$, $C_xH_y$, or any combination thereof. Additionally, curing system 400 can further include a vacuum pumping system 455 coupled to curing chamber 410 and configured to evacuate the curing chamber 410. During a curing process, substrate 425 can be subject to a purge gas environment with or without vacuum conditions.

Furthermore, curing system 400 can include a controller 460 coupled to drying chamber 410, substrate holder 420, thermal treatment device 430, IR radiation source 440, UV radiation source 445, gas injection system 450, and vacuum pumping system 455. Controller 460 includes a microprocessor, a memory, and a digital I/O port capable of generating control voltages sufficient to communicate and activate inputs to the curing system 400 as well as monitor outputs from the curing system 400. A program stored in the memory is utilized to interact with the curing system 400 according to a stored process recipe. The controller 460 can be used to configure any number of processing elements (410, 420, 430, 440, 445, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

The controllers 360 and 460 may be implemented as a DELL PRECISION WORKSTATION 610™. The controllers 360 and 460 may also be implemented as a general purpose computer, processor, digital signal processor, etc., which causes a substrate processing apparatus to perform a portion or all of the processing steps of the invention in response to the controllers 360 and 460 executing one or more sequences of one or more instructions contained in a computer readable medium. The computer readable medium or memory for holding instructions programmed according to the teachings of the invention and for containing data structures, tables, records, or other data described herein.

Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controllers 360 and 460 may be locally located relative to the drying system 300 and curing system 400, or may be remotely located relative to the drying system 300 and curing system 400 via an internet or intranet. Thus, the controllers 360 and 460 can exchange data with the drying system 300 and curing system 400 using at least one of a direct connection, an intranet, and the internet. The controllers 360 and 460 may be coupled to an intranet at a customer site (i.e., a device maker, etc.), or coupled to an intranet at a vendor site (i.e., an equipment manufacturer). Furthermore, another computer (i.e., controller, server, etc.) can access controllers 360 and 460 to exchange data via at least one of a direct connection, an intranet, and the internet.

Figure 4A:
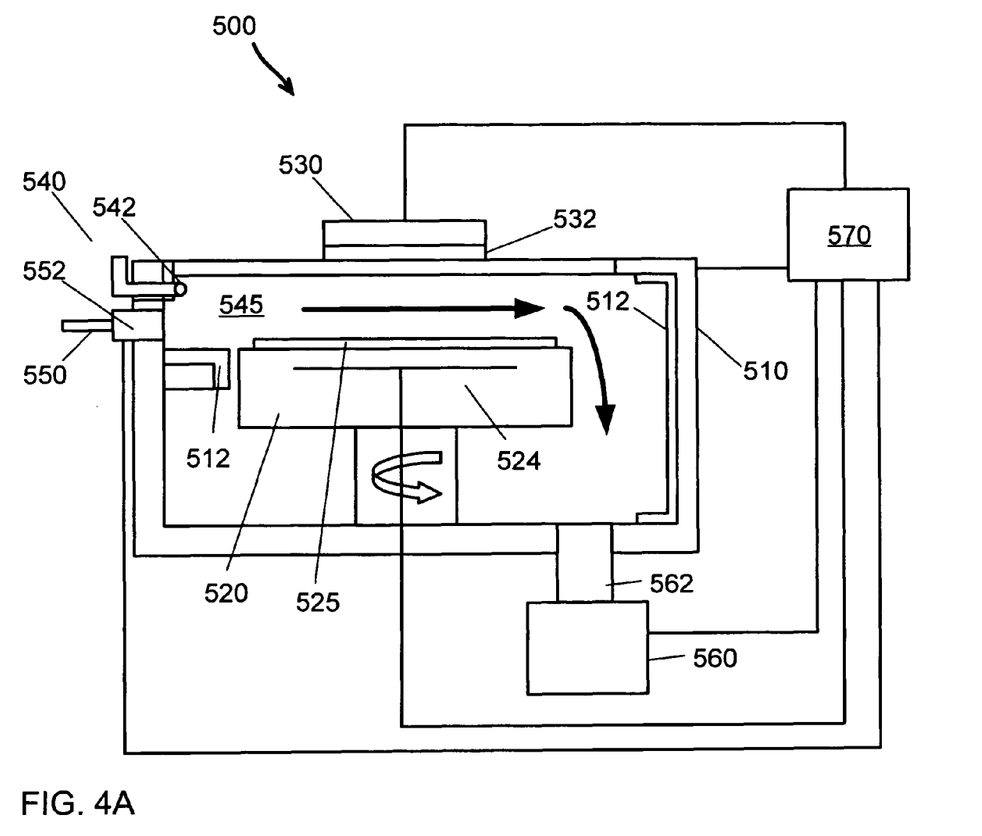
FIG. 4A is a schematic cross-sectional view of a curing system according to another embodiment of the present invention.
Figure 4B:
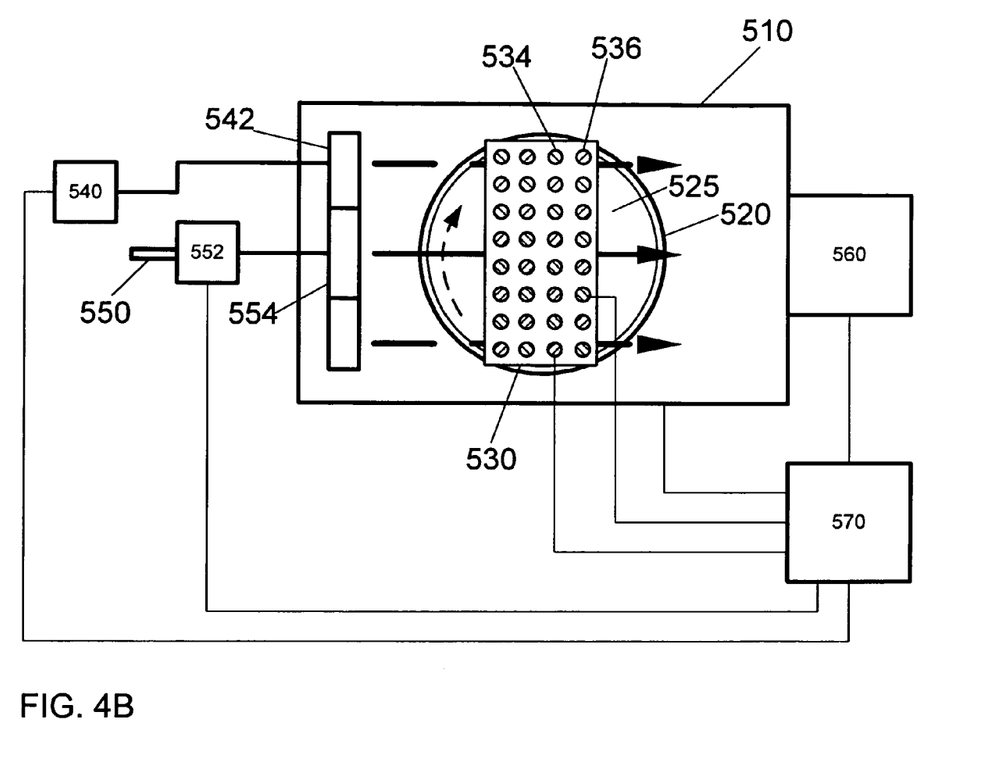
FIG. 4B is a top view of the curing system depicted in FIG. 4A.

Referring now to FIGS. 4A and 4B, a processing system 500 for curing a dielectric film on substrate 525 is presented according to another embodiment. The processing system 500 includes a process chamber 510 accommodating therein a substrate holder 520 configured to support substrate 525 and control the temperature of substrate 525.

Substrate holder 520 is equipped with a heater 524 that can be a resistive heater configured to elevate the temperature of substrate 525. Alternately, the heater 524 may be a lamp heater or any other type of heater. The temperature of substrate 525 can, for example, range from approximately 20° C. to approximately 500° C., and desirably, the temperature may range from approximately 200° C. to approximately 400° C. Additionally, the substrate holder 520 may be stationary, or it may be rotated by a drive mechanism (not shown). For example, substrate 525 can be rotated in the plane of the substrate surface at a rate of about 1 rpm (revolutions per minute) to about 60 rpm.

Furthermore, the process chamber 510 contains an exhaust line 562 connected to the bottom portion of process chamber 510 and to a vacuum pumping system 560. The process chamber 510 contains a process space 545 above substrate 525. Optionally, the inner surface of the process chamber 510 contains an inner liner 512 in order to suppress metal contamination of the substrate 525 to be processed. For example, the inner liner 512 may be fabricated from quartz, silicon, silicon nitride, silicon carbide, sapphire, alumina, aluminum nitride, carbon, anodized aluminum, coated aluminum, etc.

The process chamber 510 contains a gas supply line 540 with a gas injection device 542 located opposite the exhaust line 562 for flowing a process gas over the substrate 525. The process gas crosses the substrate 525 in a processing space 545 in a substantially laminar flow and is evacuated from the process chamber 510 through exhaust line 562 by vacuum pumping system 560. The process gas may include an inert gas, or it may include a reactive gas. Optionally, a remote plasma source 552 is connected, with a gas inlet 550 suitable for generating a plasma remotely and upstream of the substrate 525. The remote plasma source 552 can be configured to introduce reactive process gas radicals. For example, reactive material may be introduced for treating substrate 525, or reactive material may be introduced for cleaning internal surfaces of process chamber 510. Furthermore, the introduction of process gas from gas injection device 542 or remote plasma source 552 may be spatially adjusted in order to provide a uniform flow of gases over substrate 525.

Referring still to FIGS. 4A and 4B, processing system 500 further comprises a multi-spectrum radiation source 530 coupled to process chamber 510. The substrate 525 is exposed to infrared (IR) and ultraviolet (UV) radiation from the multi-spectrum radiation source 530, whereby the multi-spectrum radiation source 530 emits electro-magnetic (EM) radiation through a transparent window 532 into the processing space 545 above the substrate 525. As shown in FIGS. 4A and 4B, the multi-spectrum radiation source 530 may be positioned substantially directly above substrate 525. Alternately, the multi-spectrum radiation source 530 may be positioned above substrate 525 and between the gas injection device 542 and the center of substrate 525.

The multi-spectrum radiation source 530 comprises a first array 534 of IR sources configured to and arranged to irradiate substrate 525 with IR radiation, and a second array 536 of UV sources configured to and arranged to irradiate substrate 525 with UV radiation. Each IR radiation source can include one or more light-emitting diodes (LEDs) (continuous wave (CW), tunable, or pulsed). The IR power density can range from approximately 0.1 mW/cm$^2$ to approximately 1000 mW/cm$^2$. The IR radiation wavelength can range from approximately 1 micron to approximately 30 microns and, desirably, can range from approximately 8 microns to approximately 14 microns. Each UV radiation source can include one or more UV LEDs (continuous wave (CW), tunable, or pulsed). The UV power density can range from approximately 0.1 mW/cm$^2$ to approximately 1000 mW/cm$^2$. The UV wavelength can range from approximately 100 nanometers (nm) to approximately 600 nm and, desirably, can range from approximately 200 nm to approximately 400 mm.

The array of IR radiation sources 534, or the array of UV radiation sources 536, or both, may include any number of optical devices to adjust one or more properties of the output radiation. For example, each source may further include optical filters, optical lenses, beam expanders, beam collimators, etc. Such optical manipulation devices as known to those skilled in the art of optics and EM wave propagation are suitable for the invention. Additionally, for example, each IR radiation source, or each UV radiation source, or both, can be operated in continuous mode or pulsed mode. Further yet, for example, the array of IR radiation sources 534, or the array of UV radiation sources 536, or both, can be adjusted in temperature using temperature control elements, such as a fluid cooling (or heating) system, thermo-electric devices, or cryogenic cooling system, or a combination of two or more thereof. Furthermore, for example, a movable shutter (not shown) may be utilized to protect transparent window 532 when the IR radiation sources and the UV radiation sources are not in use.

The first and second arrays 534, 536 of radiation sources may be located according to a rectangular pattern, as shown in FIG. 4B. Alternately, the first and second arrays 534, 536 can be located according to a circular pattern, or triangular pattern, or a hexagonal pattern, or a fraction of any pattern thereof, or any pattern sufficient for uniformly irradiating substrate 525. The first array 534 of IR sources and the second array 536 of UV sources may be interspersed amongst one another. For example, the first array 534 of IR sources and the second array 536 of UV sources may be organized in a pattern such that IR sources (leftward-leaning cross-hatching) and UV sources (rightward-leaning cross-hatching) are alternated, as shown in FIG. 4B. Alternately, the first array 534 of IR sources may be grouped together and arranged separate from the grouping of the second array 536 of UV sources. For example, the first array 534 of IR source may comprise a line, or plurality of lines, of individual IR sources arranged above one location on substrate 525, and the second array 536 of UV sources may comprise a line, or plurality of lines, of individual UV sources arranged above another location on substrate 525.

The position of IR radiation sources and UV radiation sources above substrate 525, the distance between the radiation sources and the substrate coupled with the angular variation of radiation intensity from the radiation sources, and the spacing of radiation sources can affect the uniformity of radiative treatment to substrate 525. Desirably, the design parameters are selected such that radiation incident on substrate 525 is substantially uniform. Substrate rotation may be utilized to further improve or adjust process uniformity.

For example, IR and UV LEDs can range in size from several millimeters in diameter to approximately 1-2 centimeters in diameter. Additionally, the output may range from several milliwatts to approximately 5 to 10 watts or more, and the viewing half angle may range from less than 10 degrees to greater than 90 degrees. Typically, commercially available LEDs have a viewing half angle ranging from approximately 5 degrees to approximately 30 degrees. For an LED having a viewing half angle of 20 degrees, the spot size (radiant intensity approximately uniform) on a substrate placed 3 cm from the radiation source is approximately 2 cm. Therefore, adjacent radiation sources (of the same type, IR versus UV) may be spaced about every 2 cm. According to one example, IR and UV radiation sources are located above the substrate and substantially cover the substrate. Additionally, the IR and UV radiation sources are spaced relative to one another and positioned in such quantity to provide substantially uniform irradiation of the substrate. In this example, it may not be necessary to translate or rotate the substrate. According to another example, IR and UV radiation sources are located above the substrate and partially cover the substrate (as illustrated in FIG. 4B). In this example, it is necessary to translate or rotate the substrate in order to attain a substantially uniform irradiation of the substrate. Partial coverage of the substrate is a consequence of the LED minimum spacing shown for example in FIG. 4B. Substrate rotation, in one embodiment of the invention, permits partial array coverage at wider lamp spacing (i.e., lower heat density at the source) and still achieves uniform exposure. Furthermore, a lower limit of the UV wavelength range can be chosen to substantially avoid surface densification of the matrix material. Meanwhile, IR wavelength ranges can be chosen to correspond to peaks in absorption spectrum of the matrix material, as known in the art.

Additionally, for example, the operation of the first array 534 of IR sources and the second array 536 of UV sources may include sequential exposure of substrate 525 to IR radiation and UV radiation, concurrent exposure of substrate 525 to IR radiation and UV radiation, or over-lapping exposure of substrate 525 to IR radiation and UV radiation.

Still referring to FIG. 4A, a controller 570 includes a microprocessor, a memory, and a digital I/O port capable of generating control voltages sufficient to communicate and activate inputs of the processing system 500 as well as monitor outputs from the processing system 500. Moreover, the controller 570 is coupled to and exchanges information with process chamber 510, the vacuum pumping system 560, the heater 524, the substrate holder 520, the multi-spectrum radiation source 530 including the first array 534 of IR radiation sources and the second array 536 of UV radiation sources, the gas supply system configured to supply gas to gas supply line 540 and remote plasma source 552, and the remote plasma source 552. The controller 570 may be implemented as a UNIX-based workstation. Alternately, the controller 570 can be implemented as a general-purpose computer, digital signal processing system, etc.

Figure 5:
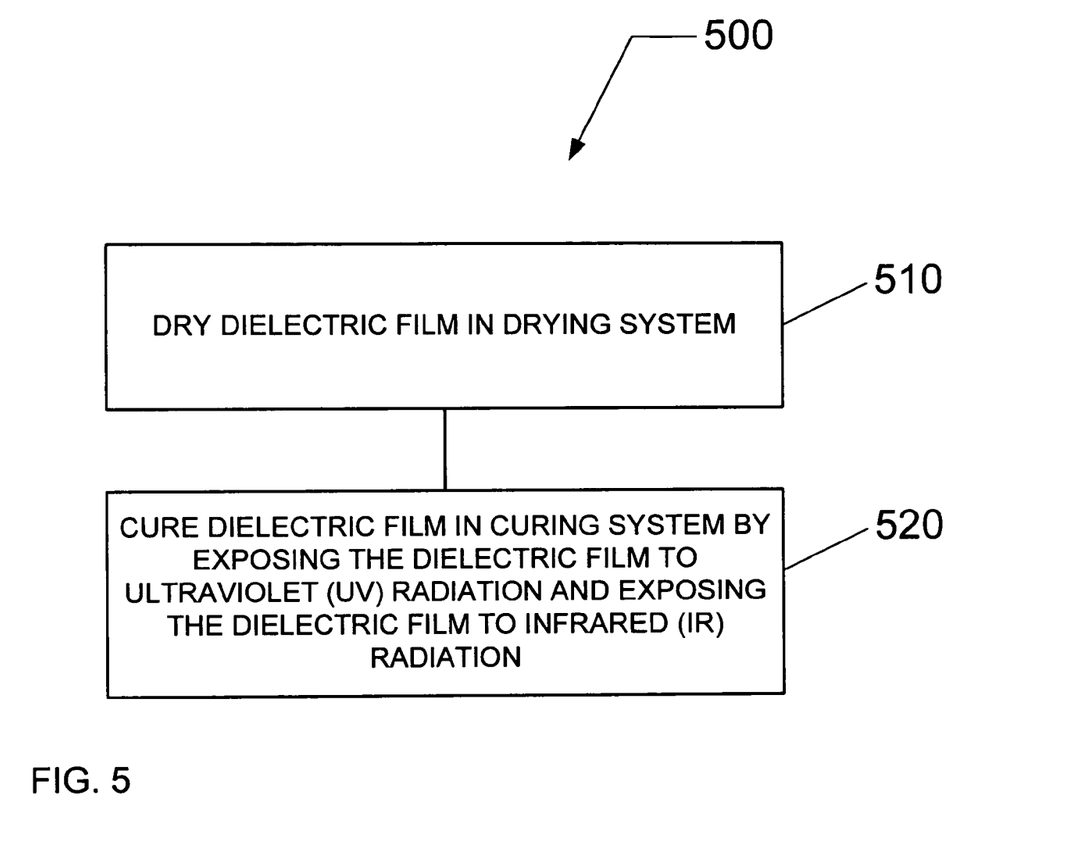
FIG. 5 is a flow chart of a method of treating a dielectric film according to yet another embodiment of the present invention.

Referring now to FIG. 5, a method of treating a dielectric film on a substrate is described according to another embodiment. The method includes a flow chart 500 beginning in 510 with drying the dielectric film on the substrate in a first processing system. The first processing system includes a drying system configured to remove, or partially remove, one or more contaminants in the dielectric film, including, for example, moisture, solvent, porogen, or any other contaminant that may interfere with a subsequent curing process.

In 520, the dielectric film is cured in a second processing system. The second processing system includes a curing system configured to cure the dielectric film by causing or partially causing cross-linking within the dielectric film in order to, for example, improve the mechanical properties of the dielectric film. Following the drying process, the substrate can be transferred from the first process system to the second processing system under vacuum in order to minimize contamination. Therein, the substrate is exposed to UV radiation and IR radiation. Additionally, following the drying and curing processes, the dielectric film may optionally be post-treated in a post-treatment system configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions. One such post-treatment that can be suitable for the present invention is described in U.S. Pat. No. 5,714,437, entitled Method of improving adhesion between thin films, the entire contents of which are incorporated herein by reference.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A processing system for treating a low K dielectric film on a substrate, comprising:
    a process chamber configured to facilitate said treatment process;
    a substrate holder coupled to said process chamber, and configured to support said substrate in said process chamber;
    a temperature control system coupled to said substrate holder and configured to elevate a temperature of said substrate;
    a multi-spectrum radiation source disposed inside said process chamber, and configured to directly irradiate said low K dielectric film on the substrate with infrared (IR) radiation and ultraviolet (UV) radiation,
    said multi-spectrum radiation source including;
        an IR radiation source configured to emit IR light ranging from approximately 8 microns to approximately 14 microns, and
        a UV radiation source configured to emit UV light ranging from approximately 100 nm to approximately 400 nm;
        said IR radiation source and said UV radiation source configured to concurrently expose the low K dielectric film;

a vacuum pumping system coupled to said process chamber, and configured to evacuate said process chamber; and a processor having program instructions to selectively control both the IR radiation source and the UV radiation source so that the low K dielectric film having a dielectric constant less than 2.5 on the substrate in the process chamber is exposed to multi-spectrum radiation from the IR radiation source and the UV radiation source and so that different wavelengths of different energy levels are 1) available at different stages of a radiation treatment of the low K dielectric film with exposure of the low K dielectric film to the UV radiation source occurring with exposure of the low K dielectric film to the IR radiation source and 2) both radiate the low K dielectric film to cumulatively cure the dielectric film.

2. The system of claim 1, wherein said IR radiation source comprises a first array of IR sources and said UV radiation source comprises a second array of UV sources arranged in a rectangular pattern above said substrate.

3. The system of claim 1, wherein said IR radiation source comprises a first array of IR sources and said UV radiation source comprises a second array of UV sources arranged in a circular pattern above said substrate.

4. The system of claim 1, wherein said IR radiation source comprises a first array of IR sources and said UV radiation source comprises a second array of UV sources configured to emit light that substantially covers said substrate.

5. The system of claim 1, wherein said IR radiation source comprises a first array of IR sources and said UV radiation source comprises a second array of UV sources configured to emit light that partially covers said substrate.

6. The system of claim 1, wherein said substrate holder comprises a rotatable substrate holder configured to rotate said substrate about an axis perpendicular to the substrate plane.

7. The system of claim 1, wherein said UV radiation source comprises UV LEDs.

8. The system of claim 1, wherein said temperature control system comprises a resistive heating element coupled to said substrate holder.

9. The system of claim 8, wherein said temperature control system is configured to elevate the temperature of said substrate from approximately 200° C. to approximately 400° C.

10. The system of claim 1, further comprising:
a gas supply system coupled to said process chamber, and configured to introduce a process gas to said process chamber.

11. The system of claim 10, wherein said gas supply system is configured to supply an inert gas to said process chamber.

12. The system of claim 10, wherein said gas supply system is configured to supply a reactive gas to said process chamber.

13. The system of claim 10, wherein said gas supply system is configured to introduce said process gas to said process chamber such that a substantially parallel flow of process gas over said substrate is created.

14. The system of claim 1, further comprising:
a remote plasma source coupled to said process chamber, and configured to introduce plasma radicals to said process chamber.

15. The system of claim 1, further comprising:
an inner liner coupled to an interior surface of said process chamber and configured to reduce contamination of said substrate.

16. The system of claim 15, wherein said inner liner is fabricated from one or more of quartz, silicon, silicon nitride, silicon carbide, sapphire, alumina, aluminum nitride, carbon, anodized aluminum, or coated aluminum, or a combination of two or more thereof.

17. The system of claim 1, further comprising:
a drying chamber coupled by a transfer mechanism to the processing chamber.

18. The system of claim 17, further comprising:
a transfer chamber configured to transfer the substrate from the process chamber to the drying chamber.

19. The system of claim 17, further comprising:
a measurement apparatus coupled to said drying chamber, and configured to monitor a level of reduction of contaminants in said dielectric film on said substrate.

20. The system of claim 19, wherein said measurement apparatus comprises an apparatus configured to perform Fourier transform infrared spectroscopy or mass spectroscopy.

* * * * *